US005991909A

United States Patent [19]
Rajski et al.

[11] Patent Number: 5,991,909
[45] Date of Patent: Nov. 23, 1999

[54] PARALLEL DECOMPRESSOR AND RELATED METHODS AND APPARATUSES

[75] Inventors: Janusz Rajski, West Linn, Oreg.; Jerzy Tyszer, Poznan, Poland

[73] Assignee: Mentor Graphics Corporation, Wilsonville, Oreg.

[21] Appl. No.: 08/730,066

[22] Filed: Oct. 15, 1996

[51] Int. Cl.$^6$ .................................................. G01R 31/28
[52] U.S. Cl. ............................................. 714/729; 714/738
[58] Field of Search ............................. 371/22.34, 22.31, 371/22.32, 22.33, 22.4, 22.5, 22.6, 27.1, 27.2, 27.4, 27.7; 395/183.06, 183.08; 364/717, 715.02; 324/73.1; 714/729, 726, 727, 728, 735, 733, 734, 738, 739, 741, 744, 30, 32

[56] References Cited

U.S. PATENT DOCUMENTS

| 4,713,605 | 12/1987 | Iyer et al. | 371/25.1 |
|---|---|---|---|
| 4,718,065 | 1/1988 | Boyle et al. | 371/25.1 |
| 5,029,171 | 7/1991 | Lee et al. | 371/27.7 |
| 5,412,665 | 5/1995 | Gruodis et al. | 371/27.2 |
| 5,574,733 | 11/1996 | Kim | 371/22.33 |
| 5,694,401 | 12/1997 | Gibson | 395/183.06 |

OTHER PUBLICATIONS

Computer System Architecture (2nd Edition), M. Morris Mano; Prentice–Hall, Inc. 1982; pp. 53–54.
Agrawal, V. et al., "A Tutorial on Built–In Self Test, Part 1: Principles" IEEE Design & Test of Computers, Mar. 1993, pp. 73–82.
Agrawal, V. et al., "A Tutorial on Built–In Self Test, Part 2: Applications" IEEE Design & Test of Computers, Jun. 1993, pp. 69–75.
Hellebrand, S. et al., "Pattern Generation for a Deterministic BIST Scheme," IEEE Abstract, 1995, pp. 88–94.
Hellebrand, S. et al., "Built–In Test for Circuits with Scan Based on Reseeding of Multiple–Polynomial Linear Feedback Shift Registers," IEEE Transactions on Computers, vol. 44, No. 2, Feb. 1995, pp. 223–233.
Zacharia, N. et al., "Decompression of Test Data Using Variable–Length Seed LFSRs," Abstract, 8 pgs.
Konemann, Dr. Bernd, "LFSR–Coded Test Patterns for Scan Designs," Abstract, pp. 237–242.

*Primary Examiner*—Trinh L. Tu
*Attorney, Agent, or Firm*—Blakely Sokoloff Taylor & Zafman, LLP

[57] ABSTRACT

A parallel decompressor capable of concurrently generating in parallel multiple portions of a deterministic partially specified data vector is disclosed. The parallel decompressor is also capable of functioning as a PRPG for generating pseudo-random data vectors. The parallel decompressor is suitable for incorporation into BIST circuitry of ICs. For BIST circuitry with multiple scan chains, the parallel decompressor may be incorporated without requiring additional flip-flops (beyond those presence in the LFSR and scan chains). In one embodiment, an incorporating IC includes boundary scan design compatible with the IEEE 1194.1 standard. Multiple ones of such ICs may be incorporated in a circuit board. Software tools for generating ICs with boundary scan having BIST circuitry incorporated with the parallel decompressor, and for computing the test data seeds for the deterministic partially specified test vectors are also disclosed.

36 Claims, 9 Drawing Sheets

PARALLEL DECOMPRESSOR AND RELATED METHODS AND APPARATUSES

BACKGROUND OF THE INVENTION

1. Field of the Invention

The present invention relates generally to testing of integrated circuits (IC) and more particularly relates to generation of deterministic partially specified test vectors for built-in-self-test of ICs.

2. Background Information

An unprecedented proliferation of very large scale integrated (VLSI) circuits is accompanied by quickly increasing cost of their testing which in many areas became a major or even predominant component of the overall costs associated with manufacturing and shipping of integrated circuits. This is largely because contemporary test system technologies continue to follow traditional methodologies in which test vectors are applied and test responses are analyzed by means of an expensive external testing equipment. With rising off-chip frequencies and chip pad counts being highly unbalanced by increasing complexity of circuits, there is an indispensable need to use lower-priced test systems enhancing the traditional test methods in terms of reduced dependency on physical probes, at-speed test capabilities, increased test portability, and significantly reduced test costs.

In built-in self-test (BIST) approach, now an emerging means of testing and alternative for conventional techniques, on-chip hardware both generates test patterns and evaluates output data. Test patterns are typically generated by a test pattern generator, and output data evaluation usually consists of a test response compaction, in which multiple-input signature registers (MISRs) compact output sequences of a circuit under test (CUT) into a few-bit signature. The general state of the art in this well established area can be illustrated by, for example, V. D. Agrawal, C. R. Kime, and K. K. Saluja, "A Tutorial on Built-In Self Test. Part 1: Principles", *IEEE Design and Test of Computers,* March 1993, pp. 73–82, and V. D. Agrawal, C. R. Kime, and K. K. Saluja, "A Tutorial on Built-In Self-Test. Part 2: Applications", *IEEE Design and Test of Computers,* June 1993, pp. 69–73.

An efficient test pattern generator which guarantees complete fault coverage while minimizing test application time, area overhead, and test data storage is essential for a successful BIST scheme. Many different generation schemes have been proposed to accomplish various tradeoffs between these parameters. The solutions range from pseudo-random techniques that do not use any storage but take a long application time and often do not detect some faults, to deterministic techniques that may require significant test data storage but achieve complete fault coverage in a relatively short time. Pseudo-random test patterns are typically generated using pseudo-random pattern generators (PRPG), such as Linear Feedback Shift Registers (LFSR) constituted with flip-flops and XOR gates. Again, the aforementioned literature items provide a good reference point to the state of the art in this area.

Mixed-mode test pattern generation is an attractive alternative to the above scenarios. It uses pseudo-random patterns to cover easy-to-test faults and, subsequently, deterministic patterns to target the remaining hard-to-test faults. As opposed to other approaches, such as test point insertion, mixed-mode techniques can reach complete fault coverage without imposing circuit modifications and causing performance degradation. Moreover, it is possible to obtain different trade-offs between test data storage and test application time by varying the relative number of deterministic and pseudo-random patterns. However, the overall efficiency of BIST scheme resting on mixed-mode generators strongly depends on the methods employed to reduce the amount of test data.

There are two main approaches to reduce the quantity of test data: (1) reduction of the number of deterministic patterns by using dynamic compaction algorithms that target several single faults with a single pattern; and (2) compression of deterministic test cubes by exploiting the fact that frequently they feature a large number of unspecified positions. One of the methods to compress test cubes is based on the reseeding of LFSR and has been originally proposed by B. Koeneinann in the paper entitled "LFSR-Coded Test Patterns for Scan Designs", in *Proc. European Test Conf,* Munich 1991, pp. 237–242. A comprehensive analysis of this scheme as well as a new reseeding scenario based on Multiple Polynomial Linear Feedback Shift Registers (MP-LFSRs) has been provided by S. Hellebrand, J. Rajski, S. Tamick, S. Venkataraman and B. Courtois in the paper entitled "Built-In Test for Circuits with Scan Based on Reseeding of Multiple-Polynomial Linear Feedback Shift Registers", *IEEE Trans. on Computers,* vol, C44, Feb. 1995, pp. 223–233. A similar technique has been also discussed by S. Hellebrand, B. Reeb, S. Tarnick, and H.-J. Wunderlich in the paper entitled "Pattern Generation for a Deterministic BIST Scheme", in *Proc. ICCAD,* November 1995, pp. 88–94. An MP-LFSR is a LFSR whose XOR gates are selectively controlled e.g. by AND gates, depending on the characteristic polynomial to be represented. Using this method, a concatenated group of test cubes with a total of s specified bits is encoded with approximately s bits specifying a seed and a polynomial identifier. The content of the MP-LFSR is loaded for each test group and has to be preserved during the decompression of each test cube within the group. Accordingly, the implementation of the decompressor may involve adding many extra flip-flops, even if flip-flops of the LFSR are used for the first k bits, in order to avoid overwriting the content of the MP-LFSR during the decompression of a group of test patterns, An alternative to concatenation was proposed by N. Zacharia, J. Rajski, and J. Tyszer in the paper entitled "Decompression of Test Data using Variable-Length Seed LFSRs", *Proc. VLSI Test Symposium,* Princeton 1995, pp. 426–433. The underlying idea rests on the concept of variable-length seeds. Deterministic patterns are generated by an LFSR loaded with seeds whose lengths may be smaller than the size of the LFSR. Allowing such "shorter" seeds yields high encoding efficiency even for test cubes with varying number of specified positions. The decompression hardware is loaded for each test pattern. Hence, it is possible to implement the decompressor by using flip-flops of the scan chain, as the state of the decompressor can be overwritten between applications of test cubes. This is in contrast to the former technique which cannot share flip-flops with the scan chain, because the content of the MP-LFSR has to be preserved between decompressions of test cubes. As a result, the decompressor can be implemented without adding extra flip-flops, i.e. using the flip-flops of the LFSR and some of the flip-flops of the scan chain.

Since many ICs designed for testability include multiple scan chains, thus it is desirable to be able to extend the above described variable length reseeding technique to ICs designed to be tested with multiple scan chains.

Furthermore, one of the major advantages of BIST is its ability to operate at different levels of a circuit's architectural hierarchy. However, in order to invoke the BIST procedures and facilitate their correct execution at the board, module or system level, certain design rules must be applied. In 1990, a new testing standard was adopted by the Institute of Electrical and Electronics Engineers, Inc., and is now defined as tine IEEE Standard 1149.11 *IEEE Standard Test Access Port and Boundary-Scan Architecture*. Its overview can be found in *The Test Access Port and Boundary-Scan Architecture* by C. M. Maunder and R. E. Tulloss, IEEE Computer Society Press, 1990. The basic architecture of boundary-scan is incorporated at the integrated circuit level and essentially consists of a protocol by which various test functions can be carried out. In particular, the standard defines four (or optionally, five) new pins forming the Test Access Port (TAP): two of them (Test Clock TCK and Test Mode Select TMS) are used to control the protocol, while the remaining two pins (Test Data In TDI and Test Data Out TDO) are employed to serially shift data into and out of the circuit. The standard also specifies a simple finite state machine called the TAP controller which is driven by TCK and TMS.

Every chip designed according to the standard contains a boundary-scan Instruction Register and associated decode logic. It is used to set the mode of operation for selected data registers by means of boundary-scan instructions which always place data registers between TDI and TDO. Two registers must be always present; the Bypass Register and the Boundary Register. Several additional registers are allowed under the optional clause of the 1149.1, and they can be selected by sending the proper control sequences to the TAP controller.

Thus, it is further desirable if the variable reseeding technique can be extended to ICs designed to be tested with multiple scan chains in a manner that is compatible with the above described IEEE boundary scan architecture.

SUMMARY OF THE INVENTION

In accordance with a first aspect of the present invention, a single LFSR is combined with multiple pluralities of serially coupled flip-flops to form a parallel decompressor for concurrently generating in parallel multiple portions of a data vector. The LFSR and the multiple pluralities of serially coupled flip-flops are coupled to each other in a manner, such that during decompression, the LFSR concurrently outputs in parallel multiple data bits for the multiple pluralities of serially coupled flip-flops, while the multiple pluralities of serially coupled flip-flops concurrently output and provide in parallel feedback data bits to the LFSR, as both the LFSR and the multiple pluralities of serially coupled flip-flops shift their contents. In one embodiment, a plurality of linear logic elements are also provided to the parallel decompressor for modifying the data bits output and provided to the multiple pluralities of serially coupled flip-flops, except for a first series of the multiple pluralities of serially coupled flip-flops.

Additionally, a plurality of data paths are provided to the parallel decompressor for serially coupling the multiple pluralities of serially coupled flip-flops to form a shift register, in conjunction with the LFSR for facilitating loading of specified bits of a data seed into the parallel decompressor for generation of a deterministic partially specified data vector. A pluralities of multiplexors are also provided to select either an input bit or a feedback data bit for the LFSR, as well as to select either the output data bits of the LFSR or copies of the flip-flops' feedback data bits. In one embodiment, a plurality of unate gates are also provided to override the data bits being shifted from one series of flip-flops to another series of flip-flops, to allow constant zeroes to be provided to all or selected positions of each of the multiple pluralities of serially coupled flip-flops, thereby effectively allowing the shift register formed with the LFSR and the multiple pluralities of serially coupled flip-flops to be variable in length.

Furthermore, in one embodiment, a plurality of unate gates are provided to disable the feedback of data bits to the LFSR, allowing the LFSR to also functions as a PRPG for generating pseudo-random data vectors. In one application, the dual purpose PRPG/parallel decompressor is provided to the BIST circuitry of an IC. The BIST circuitry includes multiple scan chains, and the multiple pluralities of serially coupled flip-flops are implemented using segments of the multiple scan chains, thereby allowing the parallel decompressor of the present invention to be implemented without requiring additional flip-flops, beyond those already existed in the LFSR and the multiple scan chains. The IC includes boundary scan design. In yet another application, a plurality of these ICs are provided to a circuit board.

In accordance with another aspect of the present invention, a computer system is programmed with a software tool for generating integrated circuit designs having BIST circuitry incorporated with an embodiment of the parallel decompressor of the first aspect of present invention. The software tool includes modules for inserting the BIST circuitry in a user IC design, and for determining the test data seeds to be used by the BIST circuitry during operation to generate the deterministic partially specified test vectors for testing ICs fabricated in accordance with the modified IC design. In one embodiment, the software tool further includes a module for further inserting a boundary scan design into the user IC design, and for determining the required deterministic test patterns for testing the user IC design.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system include general purpose as well as special purpose data processing machines, systems, and the like, that are standalone, adjunct or embedded.

Various operations will be described as multiple discrete steps performed in turn in a manner that is most helpful in understanding the present invention, however, the order of description should not be construed as to imply that these operations are necessarily order dependent, in particular, the order of presentation.

Figure 1:
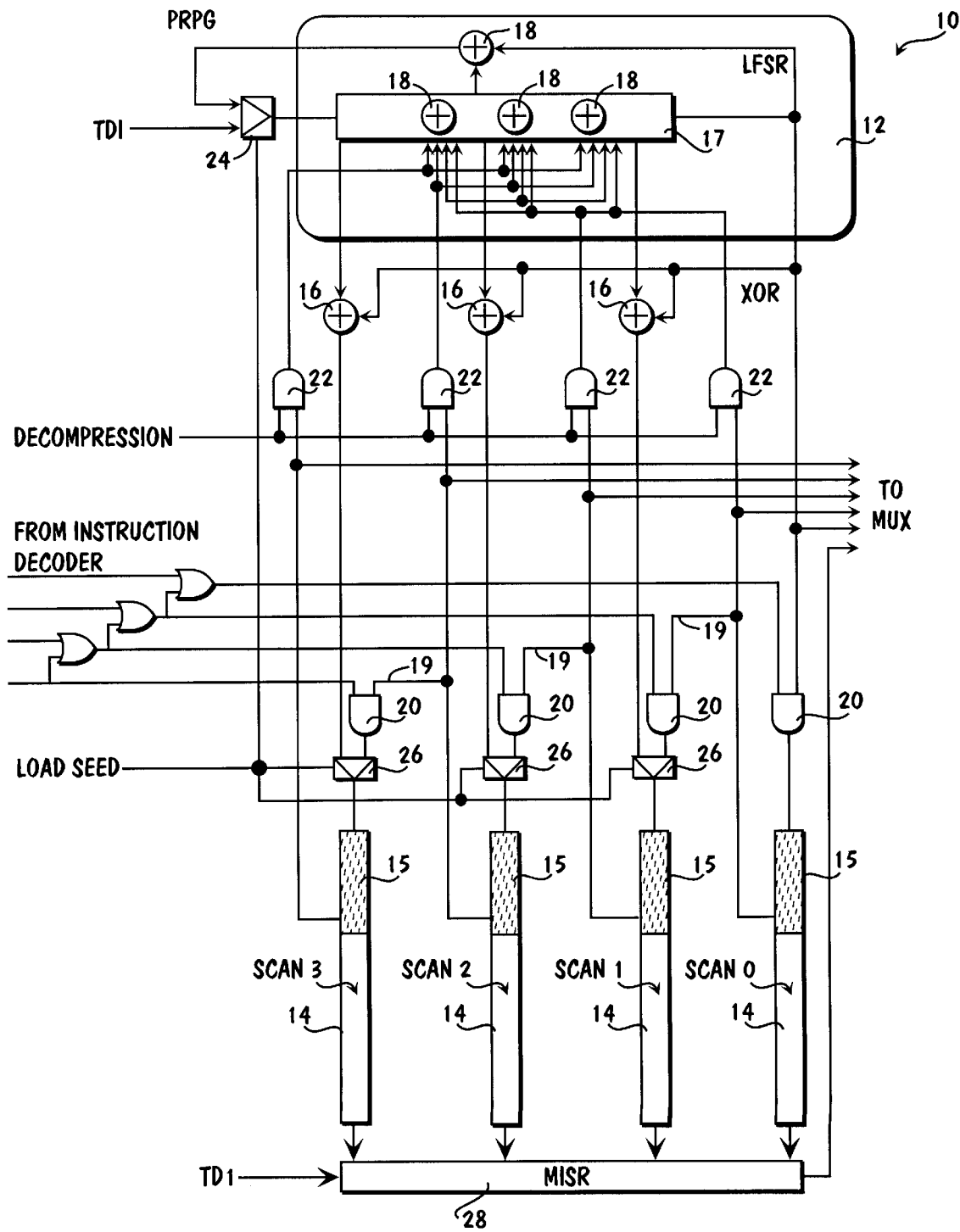
FIG. 1 illustrates one embodiment of the parallel decompressor of the present invention in the context of a BIST circuitry, suitable for incorporation in an IC.

Referring now to FIG. 1, wherein one embodiment of the parallel decompressor of the present invention is shown in the context of a BIST circuitry having multiple scan chains, suitable for incorporation into an IC. As illustrated, parallel decompressor 10 includes LFSR 12 and multiple pluralities of serially coupled flip-flops (hereinafter flip-flop chains) 15, coupled to each other as shown for concurrently generating in parallel multiple portions of a deterministic partially specified data vector, or more specifically, a deterministic partially specified test data vector, for the illustrated context. LFSR 12 and flip-flop chains 15 are coupled to each other in a manner that allows LFSR 12 to concurrently output and provide in parallel data bits to flip-flop chains 15, and at the same time flip-flop chains 15 concurrently output and provide in parallel feedback data bits to multiple sites of LFSR 12. For the illustrated embodiment, parallel decompressor 10 further includes XOR gates 16 for modifying the outputs of LFSR 12 intended for flip-flop chains 15, except for the first flip-flop chain.

Additionally, for the illustrated embodiment, parallel decompressor 10 further includes data paths 19 for serially coupling flip-flop chains 15 to form a shift register, in conjunction with LFSR 12 to facilitate loading of specified bits of a data seed into parallel decompressor 10 for generation of a deterministic partially specified data vector. For the illustrated embodiment, parallel decompressor 10 also includes multiplexors 24 and 26 for selecting either a test data input bit (TDI) or a feedback data bit for LFSR 12, as well as selecting the output data bits of LFSR 12 or data bits being shifted from one flip-flop chain 15 to another flip-flop chain. For the illustrated embodiment, parallel decompressor 10 also includes AND gates 20 for overwriting the data bits being shifted from one flip-flop chain 15 to another flip-flop chain 15, to allow constant zeroes to be provided to all or selected positions of each of flip-flop chains 15, thereby allowing the shift register formed with LFSR 12 and flip-flop chains 15 to be variable in length.

Furthermore, for the illustrated embodiment, parallel decompressor 10 further includes AND gates 22 for disabling the feedback of data bits from flip-flop chains 15 to LFSR 12, thereby allowing LFSR 12 to function as a PRPG for generating pseudo-random data vectors, more specifically, test vectors. For the illustrated embodiment, AND gates 22 are controlled by a "Decompression" signal. In other words, parallel decompressor 10 illustrated in FIG. 1 is a dual purpose PRPG/parallel decompressor having two modes of operation, a pseudo-random mode and a deterministic mode. Also, for the illustrated embodiment, flip-flop chains 15 are segments of scan chains 14 of the contextual BIST circuitry. In other words, for the illustrated embodiment, dual purpose PRPG/parallel compressor 10 of the present invention is implemented without requiring additional flip-flops beyond flip-flops that are already present in LFSR 12 and scan chains 14.

The number of sites LFSR 12 receives feedback data bits from flip-flop chains 15 depends on the feedback polynomial employed by LFSR 12. The polynomial employed should use sufficient number of feedback sites in order to reduce the probability of linear dependency, as set forth by J. Rajski and J. Tyszer in the attached paper entitled "On Linear Dependencies in Subspaces of LFSR-Generated Sequences", (see Appendix A). Consequently, the probability of not finding a seed for a given test cube will be minimized as well. In one embodiment, LFSR 14 is 32-bit and implements a feedback polynomial of $X^{32}+X^{29}+X^{11}+X^{3}+1$.

The feedback sites of LFSR 12 and the number of XOR gates 18 employed are selected in such a way that the performance of test data decompression is optimized, i.e. the compression/decompression effectiveness is maximized. In one approach, they are selected iteratively. The starting point was the configuration in which the feedback from scan number i is provided to positions $(i+2^v)$ mod $2^r$, v=0, 1, 2, . . . , r−1, of LFSR 12, where scan chains 14 are numbered from 0 to $2^r-1$. At each iteration, the design was optimized by removing connections between scan chains 14 and LFSR 12. The process was stopped when a simplification affected the compression effectiveness.

The number of scan flip-flops used by the decompression structure was selected such that the total number of flip-flops in the decompressor is greater than $S_{max}+20$, where $S_{max}$ is the maximum number of specified positions in any test cube. This insures that a seed can be obtained with probability greater than 0.999999.

Figure 2:
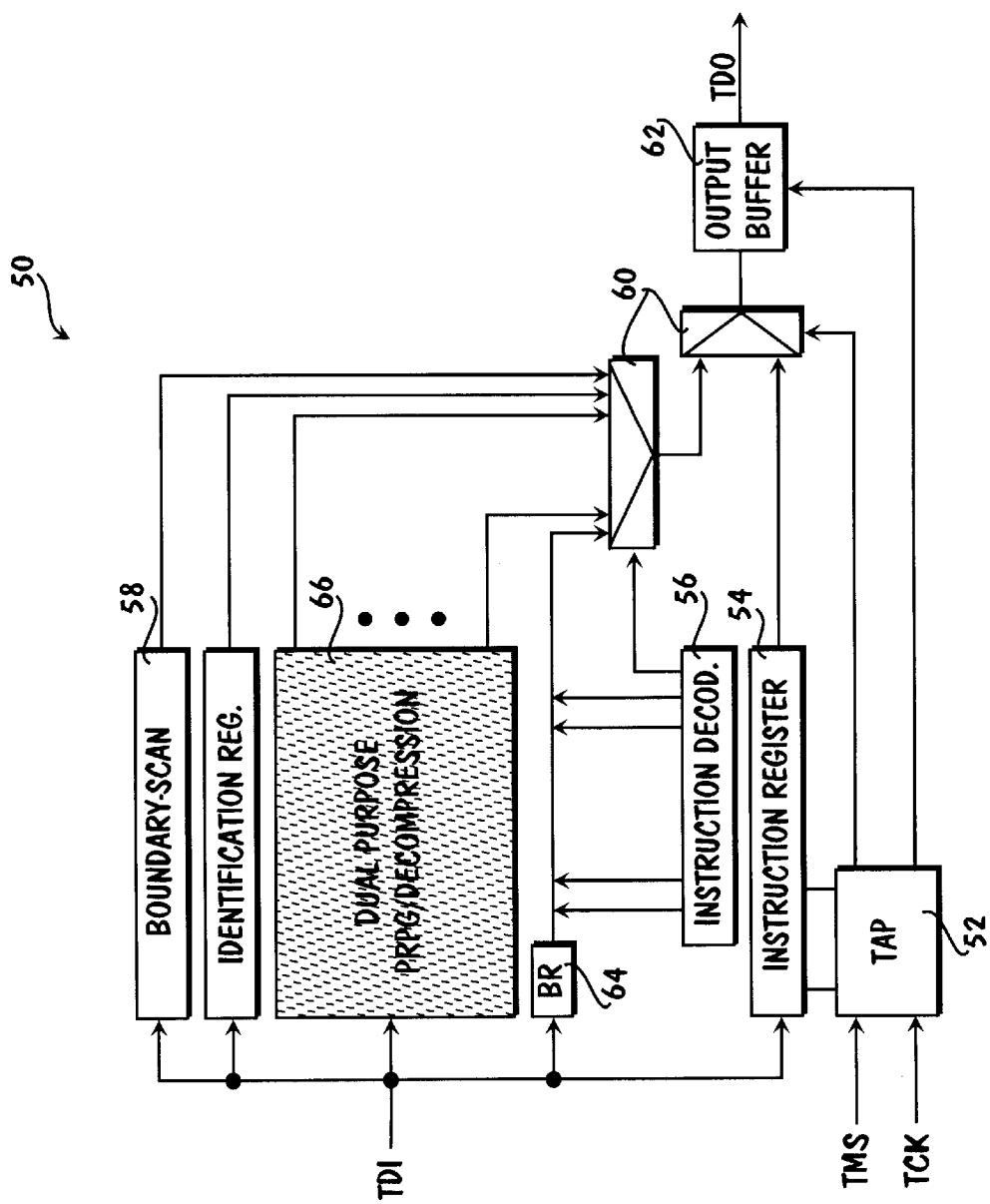
FIG. 2 illustrates one embodiment an integrated circuit incorporated with boundary scan suitable for practicing the present invention.

Referring now to FIG. 2, wherein a block diagram illustrating one embodiment of an integrated circuit design with boundary scan suitable for practicing the present invention is shown. For the illustrated embodiment, the boundary scan environment is in compliant with the above described IEEE 1194.1 standard, including TAP controller 52, instruction register 54, instruction decoder 56, boundary scan register 58, multiplexors 60, output buffer 62, by-pass register 64, TDI, TDO, TMS and TCK, as well as BIST circuitry 66 incorporated with parallel decompressor 10 of the present invention. In other words, parallel decompressor 10 appears to the IEEE 1194.1 controller as serial scan registers, further referred to as decompression registers. In fact, the decompression registers are constructed out of the same circuitry such that each of them consists of LFSR 12 and (optionally) successive parts of the internal scan chains 14 which can be selected by sending the proper sequence to TAP controller 52. Thus, even if integrated circuit 50 is mounted in a board during testing, the reseeding-based test session can be still carried out in the boundary-scan environment, to be discussed more fully below.

In addition to the standard IEEE 1194.1 instructions, several new instructions have been added for accessing parallel decompressor 10. They are:

SELPRPG: for selecting LFSR 12 only,

SELSCAN0: for selecting LFSR 12 and first $k_1$ flip-flops from the first scan chain 14, SELSCAN1: for selecting LFSR 12, first $k_1$ flip-flops from the first scan chain 14 and $k_2$ flip-flops from the second scan chain 14, and so forth.

In general, the instruction SELSCANn allows for the selection of the LFSR 12 and flip-flops from n+1 successive scan chains 14 such that a first $k_i$ flip-flops of scan chain i are always taken, i=0, . . . , n−1. Consequently, parallel decompressor 10 occurring on the die features several outgoing links (see FIG. 2) for serially shifting the seed bits out through the multiplexors and the TDO port.

Figure 3:
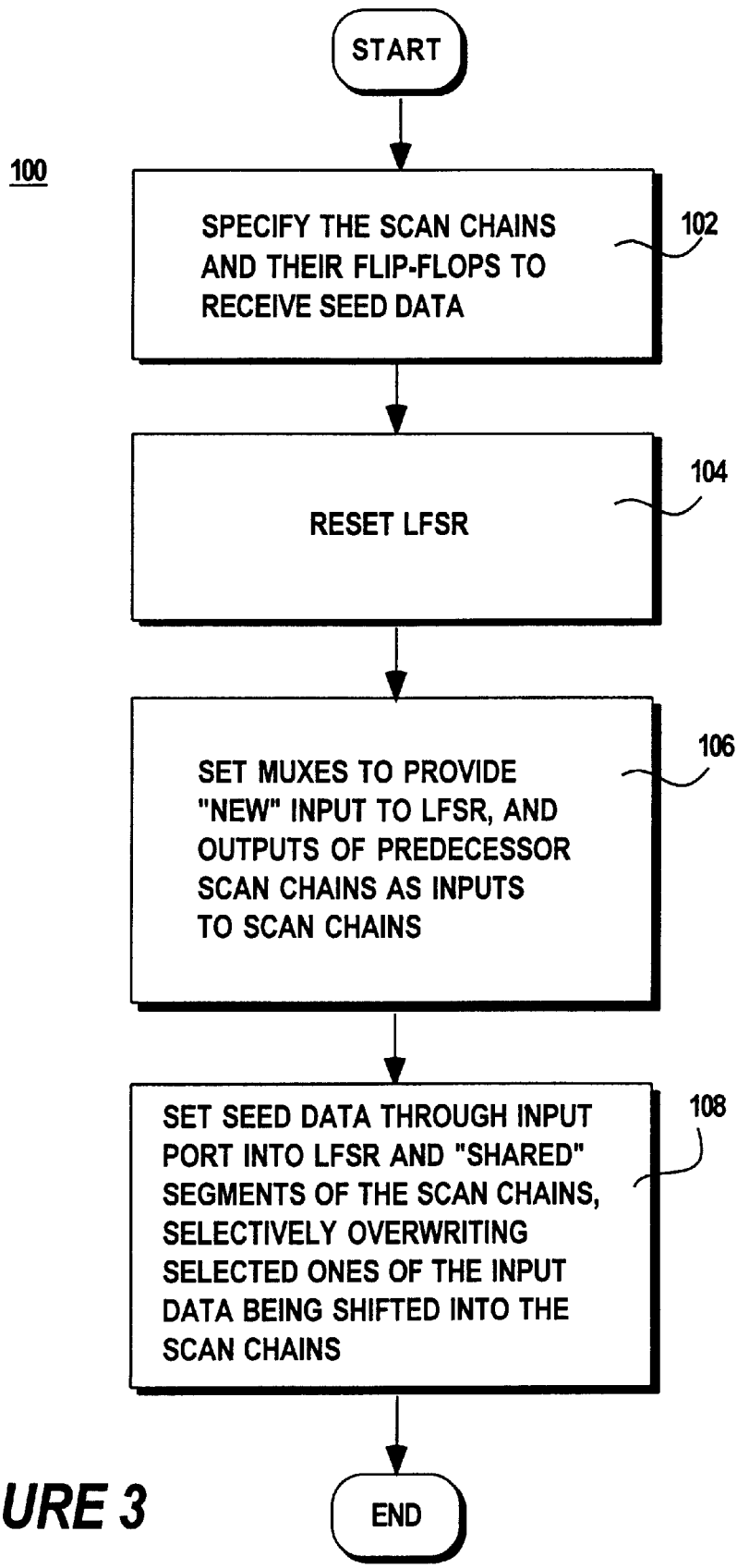
FIGS. 3–5 illustrates the method steps of the present invention for loading variable length data seeds, decompressing the data seeds, and applying the generated deterministic test patterns for a single chip.
Figure 4:
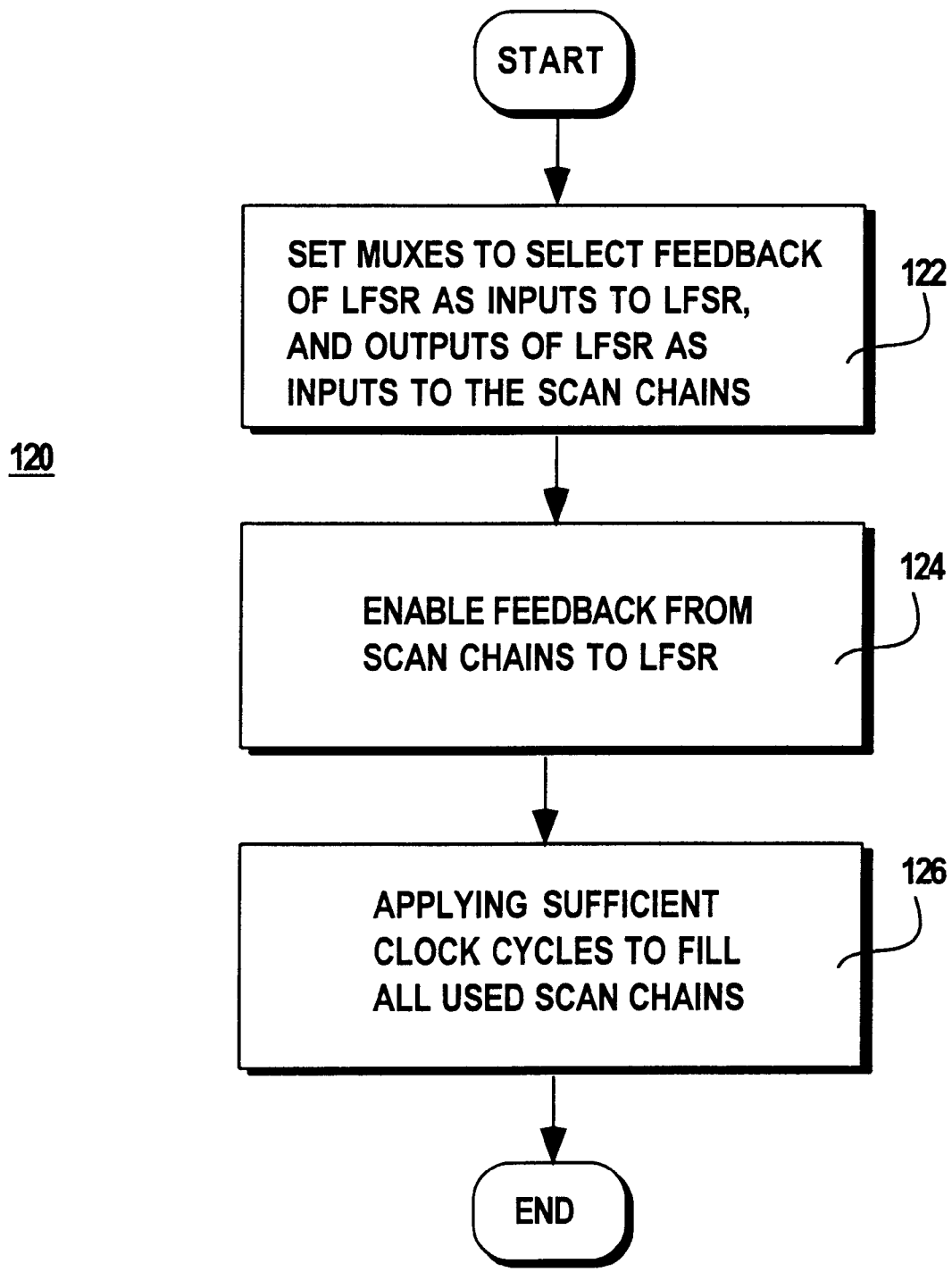
Figure 5:
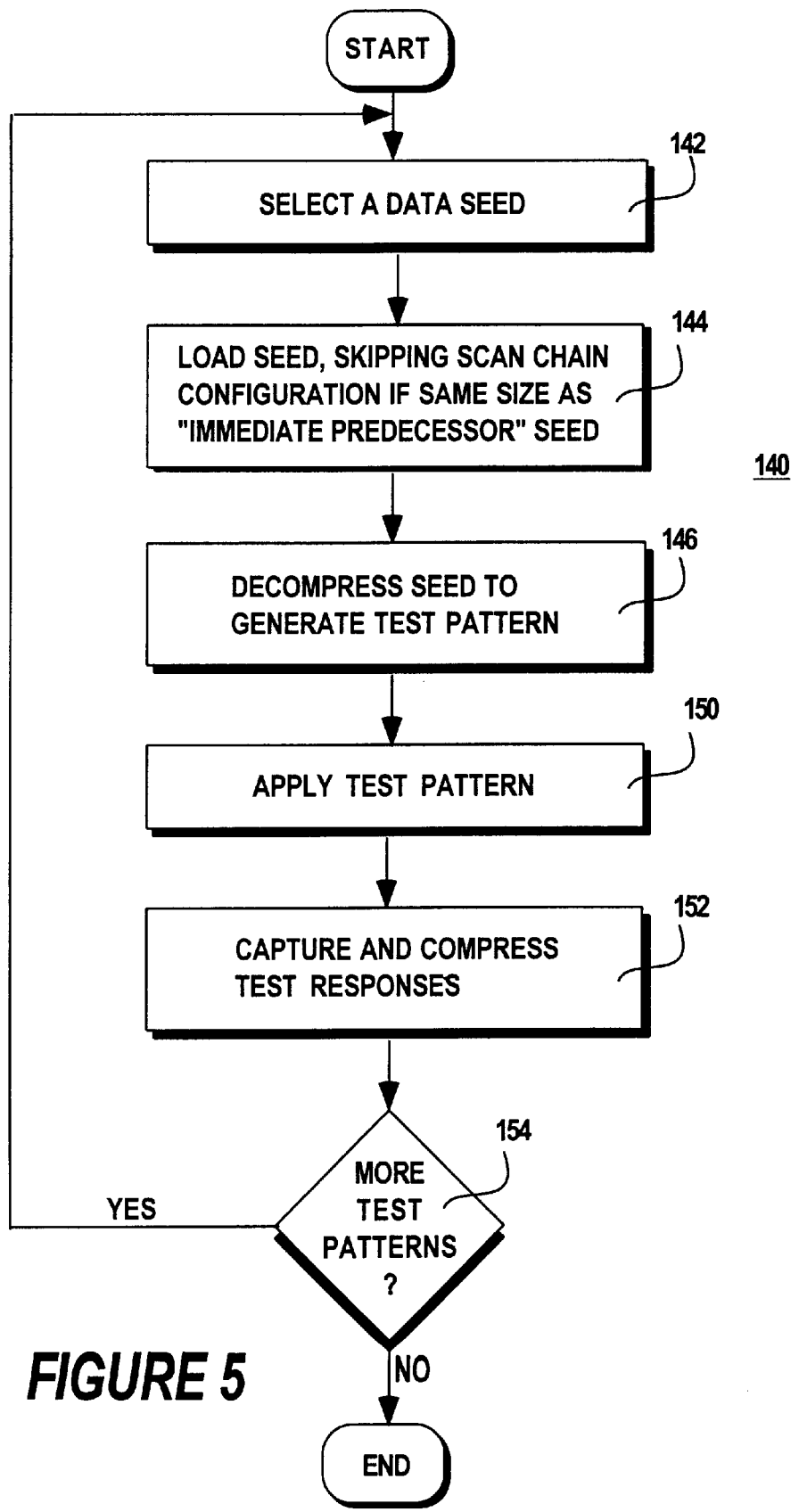

Referring now to FIGS. 3–5, wherein three flow diagrams illustrating the method steps of the present invention for loading variable length data seeds, decompressing the data seeds, and applying deterministic test patterns for an IC having BIST circuitry incorporated with parallel decompressor 10 are shown. As shown in FIG. 3, loading of a data seed starts by way of the SELSCANn instructions, specifying scan chains 14 that are to receive the data seed, step 102. Then LFSR 12 is reset, step 104. Upon resetting, multiplexors 24 and 26 are set to provide TDI to LFSR, and data bits shifted from the "predecessor" scan chains 14, step 106. Once configured, seed data are shifted through TDI into LFSR and then sequentially into the "shared" segments of scan chains 14, selectively overriding selected ones of the data bits being shifted from one scan chain 14 to another scan chain 14 with constant zeroes, as necessary, to ensure unused ones of scan chains 14 are properly initialized, step 108. Thus, a data seed is loaded into parallel decompressor 10.

As shown in FIG. 4, decompression starts by way of selecting multiplexors 24 and 26 to provide feedback data bits to LFSR 12, and output data bits from LFSR 12 to scan chains 14, step 122. Once selected, AND gates 22 are enabled by way of applying the "Decompression" signal to allow feedback of data bits to LFSR 12, from scan chains 14, step 124. Then, sufficient clock cycles are applied to fill all used scan chains 14, step 126. Accordingly, multiple portions of a deterministic partially specified data vector are concurrently generated in parallel based on the variable length seed loaded.

As shown in FIG. 5, application of test patterns to a single chip starts by way of selecting a first data seed, step 142. The selected seed is loaded as previously described with FIG. 3, skipping the step of configuring the number of scan chain used, if the seed is of the same size as the last seed loaded, step 144. Next, the loaded seed is decompressed with multiple portions of a deterministic partially specified test vector being generated in parallel, as described earlier with FIG. 4, step 146. Once generated, the deterministic partially specified test pattern is applied, step 150. The application of the generated deterministic partially specified test pattern results in test responses being generated by the circuit under test. These responses are then captured and compressed by MISR 28 in step 152. Once captured and compressed, the BIST circuitry determines if more deterministic test vectors are to be applied, step 154. If the determination is affirmative, the BIST circuitry returns to step 142. The process continues until all desired deterministic partially specified test vectors have been generated and applied. Thus, multiple portions of each deterministic partially specified test vector may be generated in parallel, and then applied, one deterministic test vector at a time, until all required deterministic test vectors have been generated and applied.

Figure 6:
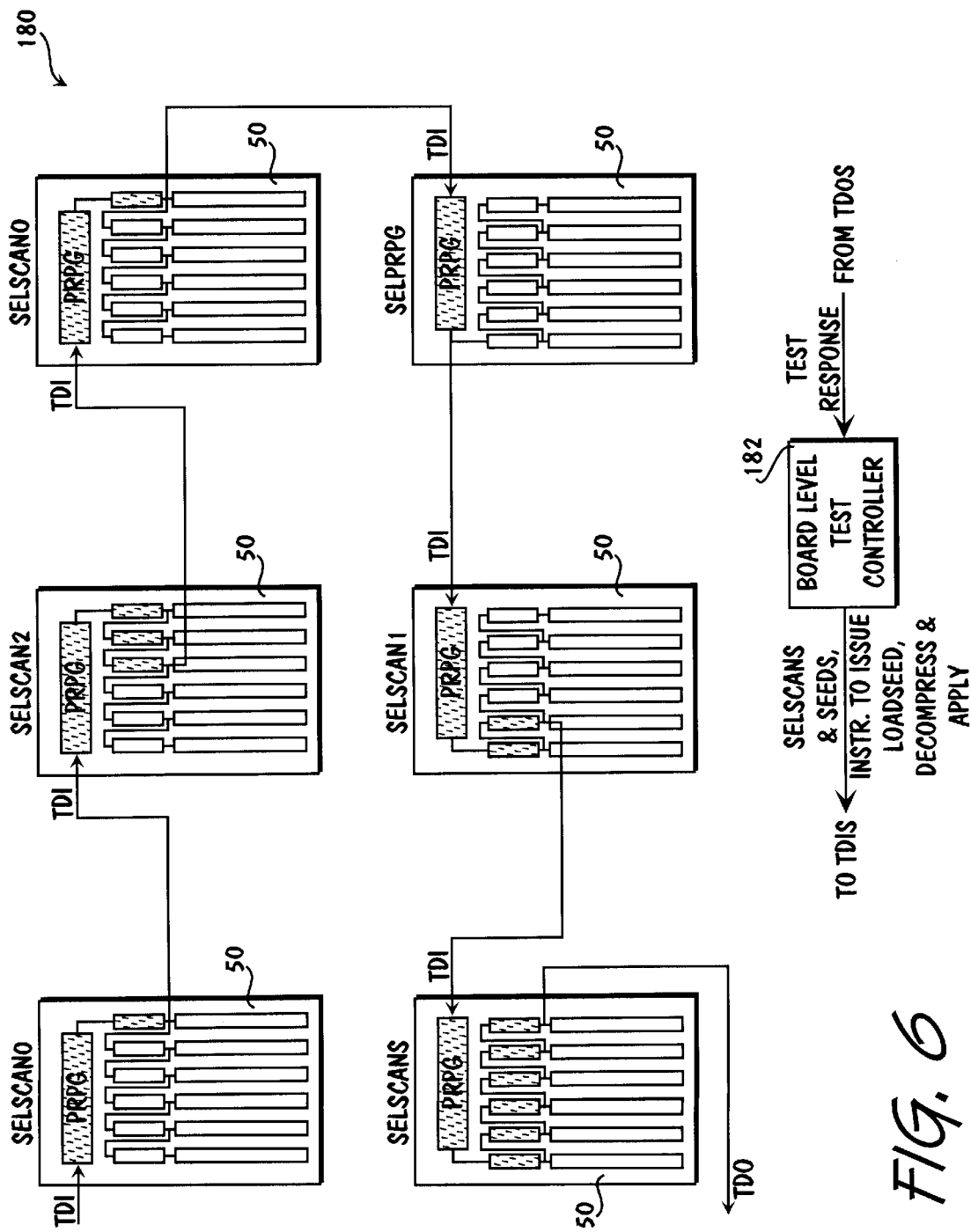
FIG. 6 illustrates one embodiment of a multi-chip environment suitable for practicing the present invention.

Referring now to FIG. 6, wherein a block diagram illustrating a multi-chip environment suitable for practicing the present invention is shown. An example of a multi-chip environment is a circuit board with multiple ICs mounted thereon. For the illustrated embodiment, while operating in the testing mode, all TDIs and TDOs of ICs 50 selected for testing are daisy-chained from chip to chip, as shown. Additionally, for the illustrated embodiment, the multi-chip environment includes board level test controller 182 for storing the seeds and their lengths, and for instructing the ICs, including configuring their TDIs and TDOs together, providing them with the appropriate SELSCANn instructions, and seeds, instructing them to load the seeds provided, decompress the seeds loaded, and applying the deterministic test patterns generated.

Figure 7:
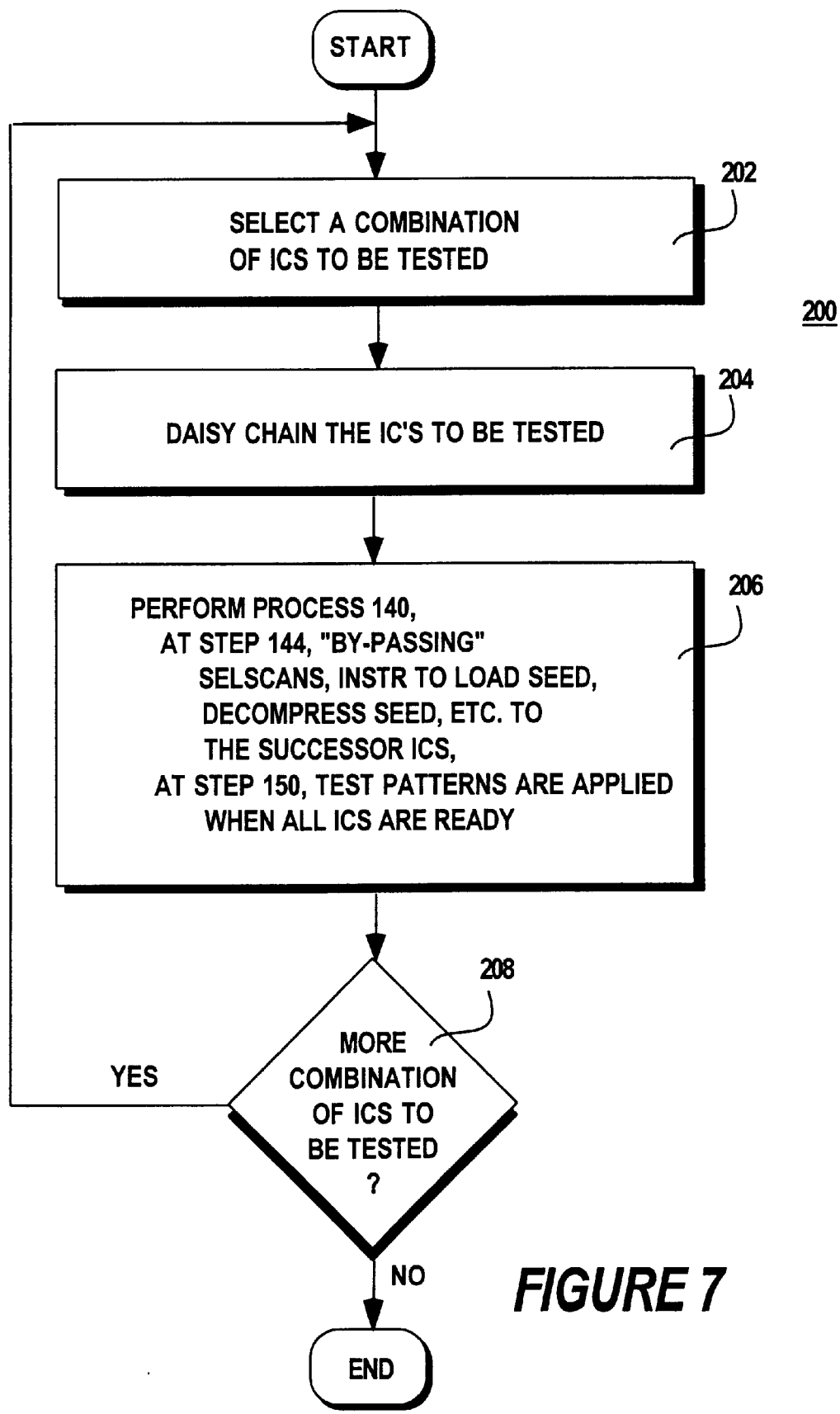
FIG. 7 illustrates the method steps of the present invention for loading variable length data seeds, decompressing the data seeds, and applying the generated deterministic test patterns for a multi-chip environment.

FIG. 7 is a flow diagram illustrating the method steps of the present invention for loading seeds, decompressing seeds, and applying the generated deterministic partially specified test patterns for a multi-chip environment. As shown, the process starts with the selection of a combination of ICs for testing, step 202. Then, board level test controller 182 of the multi-chip environment configures the selected ICs into a daisy chain, joining their TDIs and TDOs as described earlier, step 204. Once configured, board level test controller 182 of the multi-chip environment then performs process 140 described in FIG. 5, with the exception that the SELSCANn instructions, the instructions to load seeds, to decompress seeds, and to apply the generated deterministic test patterns being provided to the "inner" destination ICs 50 through the by-pass registers (64 of FIG. 2) of their predecessor ICs 50, step 206. Note that different number of scan chains may be employed in different ICs. For example, no scan chain is selected for IC3, while only one scan chain is selected for IC0 and IC2 of FIG. 6, and so forth. Furthermore, at step 150, the generated deterministic partially specified test patterns are applied when all ICs 50 have completed their respective decompressions. The next "group" of data seeds are loaded when all ICs have completed capturing test responses.

Once the testing is completed for a particular combination of ICs, the process is repeated until all IC combinations of interest have been tested.

Experiments were performed on the largest ISCAS'89 circuits described by F. Brglez, D. Bryan, and K. Kozminski in the paper entitled "Combinational Profiles of Sequential Benchmark Circuits", *Proc. Int Symp. on Circuits and Systems*, 1989, pp. 1929–1934, with 1, 4, 8, 16 and 32 scan chains. The objective of these experiments was to measure the parameters of the scheme such as test application time, test data storage, and area overhead, as well as to analyze the trade-offs between these parameters and the number of scan chains. The results are also compared with those reported in the open literature for circuits with a single scan chain.

For each circuit, 10K pseudo-random patterns were generated by the test data generator 10 working in the pseudo-random mode and applied to the circuits in order to detect the easy-to-test faults. After that, an automatic test pattern generator (ATPG) is used to generate the deterministic test patterns, or test cubes, to achieve complete stuck-at fault coverage. The resulting test cubes were then "compressed" into variable-length seeds.

The parallel decompressor used was an embodiment with a 32-bit LFSR implementing a feedback polynomial equal to $X^{32}+X^{29}+X^{11}+X^3+1$. As described earlier, the number of scan flip-flops used by the parallel decompression structure was selected such that the total number of flip-flops in the parallel decompressor is greater than $S_{max}+20$, where $S_{max}$ is the maximum number of specified positions in any test cube. The connection linear logic elements between the scan chains and the LFSR was designed iteratively, as described earlier.

Table 1 shows the characteristics of the deterministic partially specified test patterns that were generated. It lists the number of deterministic partially specified test patterns required to achieve complete fault coverage (NP), the size of each test pattern in bits (Size), the maximum number of specified bits in a test cube ($S_{max}$), and the volume of test data if the test cubes are stored explicitly in memory (Volume).

TABLE 1

| Circuit | NP | Size | Smax | Volume (bits) |
|---|---|---|---|---|
| s9234 | 104 | 247 | 112 | 25 688 |
| s13207 | 176 | 700 | 183 | 123 200 |
| s15850 | 56 | 611 | 249 | 34 216 |
| s38417 | 78 | 1664 | 472 | 129 792 |
| s38584 | 52 | 1464 | 229 | 76 128 |

Table 2 shows the results for each benchmark circuit after the seeds were obtained. The first column gives the number of scan chains inserted (NS). For each scan configuration, the table lists the length of the longest scan (LS), the number of scan flip-flops used to implement the decompressor (SFF), the number of extra 2-input XOR gates required (XORs), the amount of test data that has to be stored after compression (TD), and the compression ratio (CR). The compression ratio was calculated by dividing the total amount of storage required to explicitly store the deterministic pattern (column Volume in Table 1) by the amount of test data after compression (TD). Note that the number of extra XOR gates does not include the XOR gates required to implement the LFSR.

Several conclusions can be drawn at this point. Clearly, no additional flip-flops are required to implement the parallel decompression hardware as it uses flip-flops from the LFSR and scan chains. Moreover, the number of scan flip-flops used (SFF) is substantial: more than 200 for large circuits. This number can also be interpreted as the number of extra flip-flops that would need to be inserted if the scan flip-flops could not be used. Thus, schemes that cannot use scan flip-flops, like those based on the concatenation of patterns, would require a large number of extra hardware.

Based on Table 2, it can be seen that the amount of test data is small and comparable to the total number of specified bits in the deterministic test cubes, which yields high compression ratios. Also, there is a trade-off between the number of scan chains, the test application time, and the area overhead. Circuits with more scan chains require a shorter application time but need more XOR gates and multiplexors to implement the parallel decompressor.

TABLE 2

| Circuit | NS | LS | SFF | XORs | TD(bits) | CR |
|---|---|---|---|---|---|---|
| s9234 | 1 | 247 | 96 | 0 | 5 346 | 4.8 |
|  | 4 | 62 | 96 | 20 | 4 720 | 5.4 |
|  | 8 | 31 | 96 | 24 | 4 800 | 5.3 |
|  | 16 | 16 | 96 | 64 | 4 790 | 5.3 |
|  | 32 | 8 | 96 | 64 | 4 968 | 5.2 |
| s13207 | 1 | 700 | 192 | 0 | 5 877 | 21.0 |
|  | 4 | 175 | 192 | 12 | 5 784 | 21.3 |
|  | 8 | 88 | 192 | 32 | 5 908 | 20.8 |
|  | 16 | 44 | 192 | 48 | 5 840 | 21.0 |
|  | 32 | 22 | 192 | 96 | 6 222 | 19.8 |
| s15850 | 1 | 611 | 256 | 0 | 6 316 | 5.4 |
|  | 4 | 153 | 256 | 12 | 6 269 | 5.4 |
|  | 8 | 77 | 256 | 32 | 6 286 | 5.4 |
|  | 16 | 39 | 256 | 64 | 6 320 | 5.4 |
|  | 32 | 20 | 256 | 128 | 8 612 | 3.9 |
| s38417 | 1 | 1664 | 480 | 0 | 16 797 | 4.5 |
|  | 4 | 416 | 480 | 36 | 19 500 | 3.9 |
|  | 8 | 208 | 480 | 32 | 16 858 | 4.5 |
|  | 16 | 104 | 480 | 64 | 16 844 | 4.5 |
|  | 32 | 57 | 480 | 160 | 17 164 | 4.4 |
| s38584 | 1 | 1464 | 224 | 0 | 3 996 | 19.0 |
|  | 4 | 366 | 224 | 32 | 3 901 | 19.5 |
|  | 8 | 183 | 224 | 32 | 3 936 | 19.3 |
|  | 16 | 92 | 224 | 32 | 3 989 | 19.0 |
|  | 32 | 46 | 224 | 64 | 4 037 | 18.8 |

Table 3 compares the present invention with a scheme presented by S. Hellebrand, B. Reeb, S. Tamick, and H.-J. Wunderlich in the paper entitled "Pattern Generation for a Deterministic BIST Scheme", in Proc. ICCAD, November 1995, pp. 88–94, for some of the ISCAS circuits with a single scan chain. The scheme provided in this invention (referred to as VLR in Table 3) relies on variable-length reseeding, whereas the other scheme (referred to as HRTW in Table 3) is based on MP-LFSR reseeding and uses concatenation. Both schemes use dynamic compaction to generate test cubes targeting many single faults. For each circuit, the table reports the number of polynomials implemented by the decompressor (NPoly), the number of test cubes required to achieve complete stuck-at fault coverage (NC), the number of flip-flops needed to implement the pseudo-random generator and decompressor (Extra FFs) and the amount of test data after compression (TD).

TABLE 3

| Circuit | Scheme | NPoly | NC | Extra FFs | TD |
|---|---|---|---|---|---|
| s13207 | VLR | 1 | 176 | 32 | 5877 |
|  | HRTW | 5 | 138 (×8) | 24 | 3570 |
| s15850 | VLR | 1 | 56 | 32 | 6316 |
|  | HRTW | 5 | 134 (×8) | 46 | 6582 |
| s38417 | VLR | 1 | 78 | 32 | 16797 |
|  | HRTW | 5 | 259 (×8) | 91 | 24283 |

When comparing the results provided by VLR to those reported by S. Hellebrand, B. Reeb, S. Tamick, and H.-J. Wunderlich, several observations can be made. The parallel decompressor used by VLR is simpler since it is based on a standard LFSR rather than a multiple-polynomial LFSR and requires much simpler protocol to carry out the test experiment. An order of magnitude less patterns are needed to obtain complete fault coverage. The number of flip-flops inserted to implement the LFSR and the parallel decompressor is smaller for the larger circuits. Finally, VLR requires 15% less data on the average.

Figure 8:
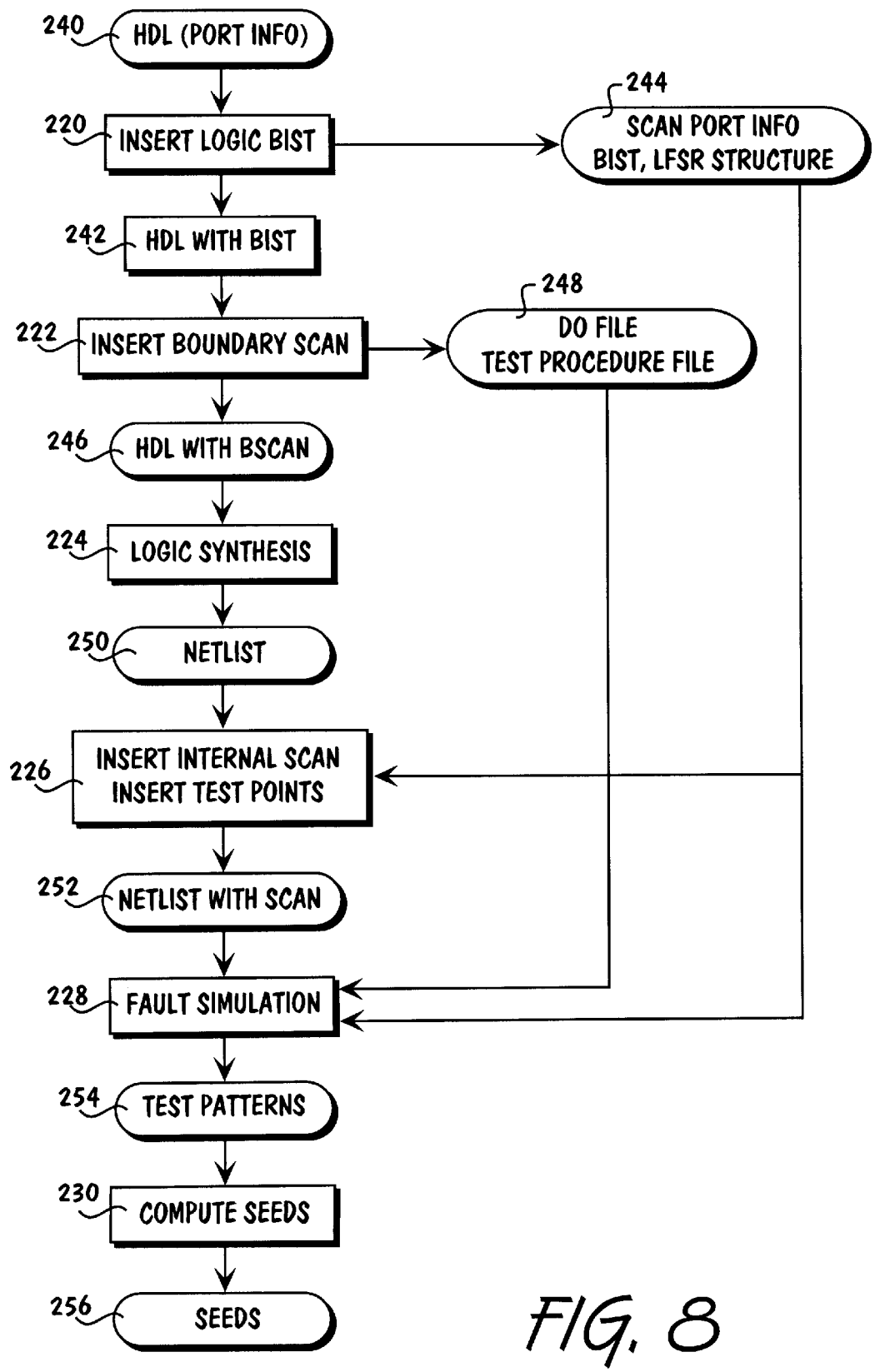
FIG. 8 illustrates one embodiment of a software tool for generating integrated circuit designs having BIST circuitry incorporated with the parallel decompressor of the present invention and boundary scan.

Referring now to FIG. 8, wherein a block diagram illustrating one embodiment of a software tool for generating integrated circuit designs with BIST circuitry incorporated with the parallel decompressor of the present invention is shown. For the illustrated embodiment, the software tool includes module 220 for inserting BIST circuitry incorporated with the parallel decompressor of the present invention in a user IC design, and module 222 for further inserting a boundary scan design into the user IC design per IEEE 1194.1 standard. Additionally, for the illustrated embodiment, the software tool also includes module 224 for logic synthesis, module 226 for inserting internal scan and test points, module 228 for performing fault simulation, and module 230 for computing test seeds.

As shown, module 220 receives the user IC design in HDL form 240, and outputs modified HDL statements 242 including BIST circuitry incorporated with a parallel decompressor of the present invention. Additionally, module 220 generates descriptions for the scan ports, the BIST circuitry and the LFSR structure 244. Module 222 receives modified HDL statements 242 as inputs, and outputs further modified HDL statement with boundary scan. Module 222 also outputs the test related files 248. Module 224 then synthesizes netlist 250 using further modified HDL statements 246, and module 226 generates annotated netlist with scan 252 based on netlist 250. Module 228 then performs fault simulation using annotated netlist 252, files 248, and information 244; and identifies the required test patterns 254 for exhaustive coverage, in particular, the required deterministic test patterns. Module 230 then computes the seeds required by parallel decompressor of the present invention.

Except for the teachings set forth in the above description to be incorporated, modules 220–230 are generally known in art. Individually and in combination, modules 220–230 are intended to represent a broad category of EDA tools and utilities known in the art. Given the parallel decompressor and related description set forth above, it is well within the ability of those skilled in the art to modified any one of a number of EDA tools in the art to incorporate the parallel decompressor and associated teachings of the present invention. With respect to test seed computation, a test cube with s specified bits can be encoded, on the average, with an s bit seed. The calculation process is equivalent to solving a system of s linear equations. This system has a solution with probability greater than 0.999999, provided an LFSR of length greater than s+20 is used, as was shown by S. Hellebrand, J. Rajski, S. Tarnick, S. Venkataraman and B. Courtois in the paper entitled "Built-In Test for Circuits with Scan Based on Reseeding of Multiple-Polynomial Linear Feedback Shift Registers", *IEEE Trans. on Computers*, vol. C44, February 1995, pp. 223–33. The system of equations can be solved very efficiently using Gauss-Jordan elimination as fast row operations can be achieved with bit-wise operations.

Figure 9:
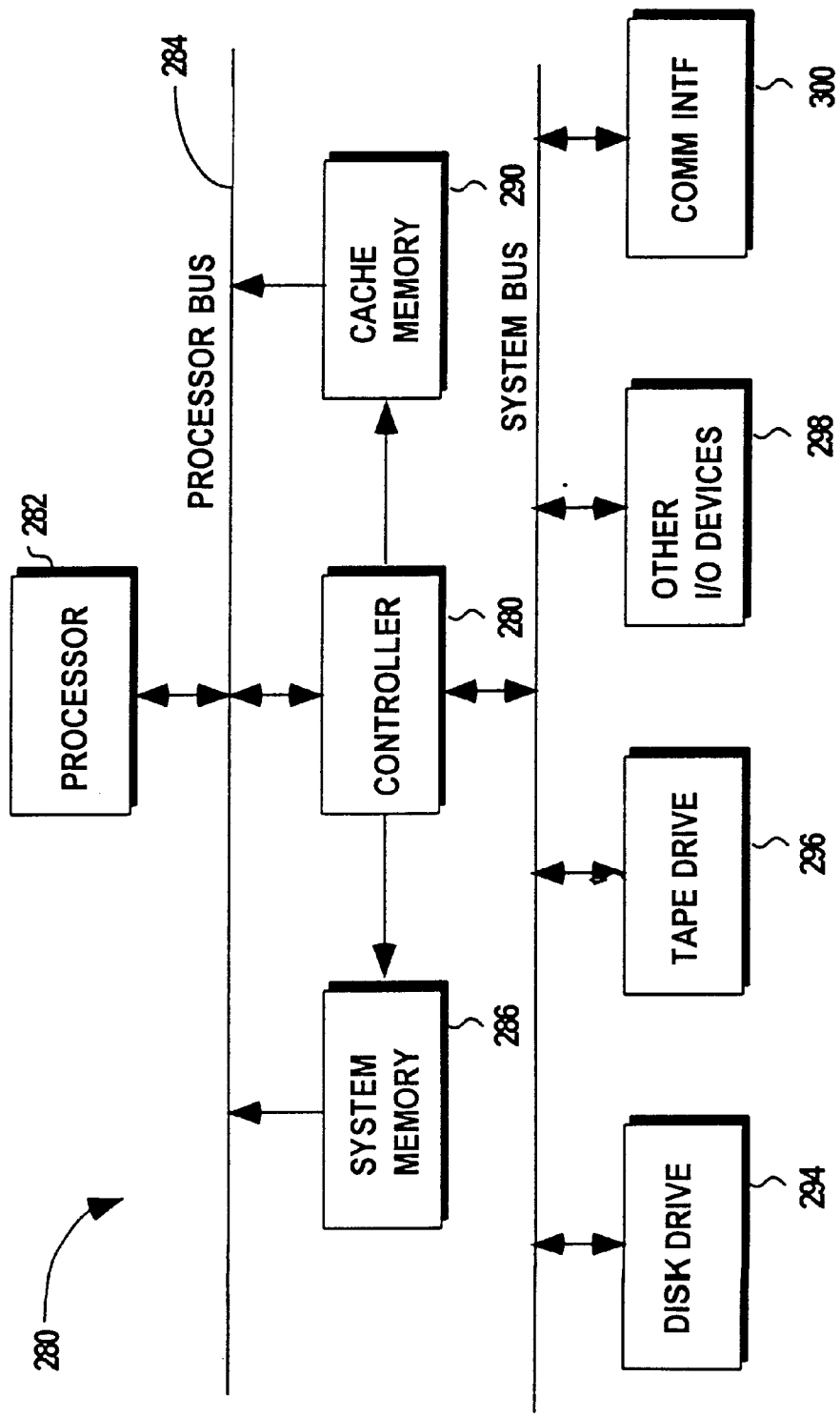
FIG. 9 illustrates one embodiment of a computer system suitable for programming with the software tool of the present invention.

FIG. 9 illustrates an exemplary computer system suitable for programmed with the software tool of FIG. 8. As shown, exemplary computer system 280 comprises processor 282, system memory 286, controller 288 and cache memory 290 coupled to processor bus 284. Controller 288 is also coupled to system bus 292, against which disk drive 294, tape drive 296, other I/O devices 298 and communication interface 300 are also coupled. Examples of other I/O devices include diskette drives, display devices, keyboards, and pointing devices etc. Except for their usage to program computer system 280 with the software tool of FIG. 8, these elements perform their conventional functions known in the art. In particular, disk drive 294 and system memory 286 are used to store permanent and execution copies of the programming instructions of the software tool as well as the intermediate results illustrated in FIG. 8. The permanent copy of the programming instructions may be preloaded in the factory, installed through a distribution medium (not shown) and one of the other I/O devices 298, or downloaded from an on-line distribution source (not shown) through communication interface 300. Tape drive 296 is used to output the "tape out" of integrated circuit designs generated in accordance with the teachings of the present invention. Other computer systems may also be employed. Exemplary computer system 280 is intended to represent a broad category of general purpose as well as special purpose computer systems.

While the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

Thus, a parallel decompressor for generating in parallel multiple portions of deterministic partially specified data vectors, having particular application for built-in self-test of multiple scan-based integrated circuits with boundary scan, and related methods and apparatuses have been described.

What is claimed is:

1. An apparatus comprising a parallel data generator to dynamically generate in parallel a plurality of portions of a deterministic data vector, the parallel data generator being formed with a linear feedback shift register (LFSR) and multiple pluralities of serially coupled flip-flops, wherein the LFSR and the multiple pluralities of serially coupled flip-flops are structurally coupled to allow the LFSR to concurrently output in parallel different data bits to different ones of the multiple pluralities of serially coupled flip-flops, and the multiple pluralities of serially coupled flip-flops to concurrently feed back in parallel different data bits to different parts of the LFSR.

2. The apparatus as set forth in claim 1, wherein the parallel data generator further includes a plurality of unate gates for disabling the concurrent feedback of data bits from the multiple pluralities of serially coupled flip-flops to the LFSR, allowing the LFSR to function as a pseudo-random pattern generator for generating pseudo-random data vectors.

3. The apparatus as set forth in claim 1, wherein the apparatus further comprises a plurality of parallel scan chains, and the multiple pluralities of serially coupled flip-flops are member flip-flops of the parallel scan chains.

4. The apparatus as set forth in claim 1, wherein the parallel data generator is further formed with a plurality of linear logical elements for modifying the different data bits being concurrently output and provided to different ones of the multiple pluralities of serially coupled flip-flops by the LFSR, except for one of the multiple pluralities of serially coupled flip-flops.

5. The apparatus as set forth in claim 1, wherein the parallel generator is further formed with a plurality of data paths for serially coupling the multiple pluralities of serially coupled flip-flops to form a shift register, in conjunction with the LFSR, to facilitate loading of a data seed.

6. The apparatus as set forth in claim 5, wherein the parallel data generator is further formed with a plurality of multiplexors for selecting for the multiple pluralities of serially coupled flip-flop either the corresponding different data bits being provided by the LFSR or data bits being provided by the predecessor series of the serially coupled flip-flops.

7. The apparatus as set forth in claim 5, wherein the parallel data generator is further formed with a plurality of unate gates to modify the different data bits being output and provided by the LFSR, and to modify the data bits being provided by predecessor series of the serially coupled flip-flops.

8. The apparatus as set forth in claim 1, wherein the parallel data generator is further formed with a multiplexor for selecting for the LFSR either a data seed or a feedback data bit from the LFSR itself.

9. An apparatus comprising a dual mode pseudo-random pattern generator (PRPG)/parallel decompressor to generate pseudo-random data vectors using a single LFSR while operating in a first mode, and to generate deterministic partially specified data vectors while operating in a second mode, with multiple portions of each deterministic partially specified data vector being generated in parallel using the same single LFSR.

10. The apparatus as set forth in claim 9, wherein the dual purpose PRPG/parallel decompressor further includes a plurality of unate gates to enable a plurality of feedback data bits to be provided to the LFSR while operating in the second mode, and to disable the provision of the plurality of feedback data bits to the LFSR while operating in the first mode.

11. An integrated circuit having built-in self-test (BIST) circuitry including a parallel data generator formed with a linear feedback shift register (LFSR) and multiple pluralities of serially coupled flip-flops, wherein the LFSR to concurrently output in parallel different data bits to different ones of the multiple pluralities of serially coupled flip-flops, and the multiple pluralities of serially coupled flip-flops concurrently feed back in parallel different data bits to different parts of the LFSR.

12. The integrated circuit as set forth in claim 1, wherein the integrated circuit further includes boundary scan registers.

13. An integrated circuit having built-in self-test (BIST) circuitry including a multi-mode pseudo-random pattern generator (PRPG)/parallel decompressor to generate pseudo-random data vectors using a single LFSR while operating in a first mode, and to generate deterministic partially specified data vectors while operating in a second mode, with multiple portions of each of the deterministic partially specified data vectors being generated in parallel using the same single LFSR used to generate the pseudo-random data vectors of the first mode.

14. The integrated circuit as set forth in claim 13, wherein the integrated circuit further includes boundary scan registers.

15. An apparatus comprising a first and a second integrated circuit having a corresponding first and a second parallel data generator with the first parallel data generator providing either an output data bit from a linear feedback shift register (LFSR) of the first parallel data generator, or a copy of a feedback data bit to the LFSR of the first parallel data generator, as input to a LFSR of the second parallel data generator.

16. The apparatus as set forth in claim 15, wherein the first and second parallel data generators are correspondingly incorporated in first and second built-in self-test (BIST) circuitry of the first and second integrated circuits, and the first and second integrated circuits further including first and second boundary scan designs respectively.

17. An apparatus comprising a first and a second integrated circuit correspondingly having a first and a second dual purpose pseudo-random pattern generator (PRPG)/parallel decompressor with the first PRPG/parallel decompressor providing either an output data bit from a linear feedback shift register (LFSR) of the first PRPG/parallel decompressor, or a copy of a feedback data bit to the LFSR of the first PRPG/parallel decompressor, as input to a LFSR of the second PRPG/parallel decompressor.

18. The apparatus as set forth in claim 17, wherein the first and second PRPG/parallel decompressors are correspondingly incorporated in first and second built-in self-test (BIST) circuitry of the first and second integrated circuits, and the first and second integrated circuits further including first and second boundary scan designs respectively.

19. A method for loading a variable length data vector into a parallel decompressor comprising:
   a) resetting a linear feedback shift register (LFSR); and
   b) shifting a variable length data seed into the LFSR and then serially to a plurality of serially coupled flip-flop chains, overriding selected ones of data bits output from one flip-flop chain to another flip-flop chain.

20. The method as set forth in claim 19, wherein step (a) further comprises specifying the flip-flop chains by specifying a number of scan chains and their member flip-flops to be employed.

21. The method as set forth in claim 19, wherein step (b) further comprises configuring a plurality of multiplexors to select a first input to a linear feedback shift register (LFSR), and to select outputs of predecessor ones of the serially coupled flip-flop chains.

22. A method for decompressing a variable length data seed to concurrently generate in parallel multiple portions of a deterministic partially specified data vector, the method comprising:
   a) configuring a linear feedback shift register (LFSR) to receive feedback data bits at selected positions of the LFSR as input;
   b) configuring a plurality of scan chains to receive in parallel different output data bits from the LFSR;
   c) enabling the scan chains to provide in parallel different feedback data bits to the plurality of selected positions of the LFSR; and
   d) repeatedly applying clock cycles to shift the contents of the LFSR and the scan chains, until all flip-flops of the scan chains are filled with output data bits from the LFSR.

23. A method for applying a deterministic partially specified test pattern to an integrated circuit, the method comprising the steps of:
   a) selecting a data seed corresponding to the deterministic partially specified test pattern;
   b) conditionally reselecting scan chains of the integrated circuit and flip-flops of the scan chains, if a seed size of the data seed is dissimilar with an immediately preceding data seed;
   c) loading the data seed into a linear feedback shift register (LFSR) and selected flip-flops of the selected scan chains;
   d) decompressing the loaded data seed to generate in parallel multiple portions of the deterministic partially specified test pattern; and
   e) applying the generated deterministic partially specified test pattern.

24. The method as set forth in claim 23, wherein the method further comprises step f) capturing test responses by the integrated circuit resulting from the application of the applied deterministic partially specified test pattern.

25. The method as set forth in claim 24, wherein the method further comprises steps g) repeating steps (a) through (f) for another deterministic partially specified test pattern, and h) repeating step (g) until all desired deterministic partially specified test patterns have been applied.

26. A method for applying a plurality of deterministic partially specified test patterns to a plurality of integrated circuits, the method comprising:

a) configuring the integrated circuits in a daisy-chained configuration with the integrated circuits sequentially outputting for each other;

b) selecting a group of data seeds corresponding to a subset of the plurality of deterministic partially specified test patterns;

c) conditionally selecting scan chains for each of the integrated circuits, and flip-flops of the selected scan chains, if seed sizes of the group of data seeds are correspondingly dissimilar with a prior group of data seeds;

d) loading the group of data seeds into a linear feedback shift register (LFSR) and specified flip-flops of selected scan chains of each of the plurality of integrated circuits;

e) decompressing the loaded group of data seeds to generate in parallel multiple portions of each of the subset of the deterministic partially specified test patterns; and f) applying the generated subset of deterministic partially specified test patterns to the plurality of integrated circuits, when step (e) is completed for all integrated circuits.

27. The method as set forth in claim 26, wherein the method further comprises step g) capturing test responses by the plurality of integrated circuits resulting from the application of the generated subset of deterministic partially specified test patterns.

28. The method as set forth in claim 27, wherein the method further comprises steps h) repeating steps (a) through (g) for another subset of the deterministic partially specified test patterns, and i) repeating step (h) until the entire plurality of deterministic partially specified test patterns have been applied to the plurality of integrated circuits.

29. A storage medium having stored therein a first plurality of programming instructions to be executed by a computer system to insert built-in self-test (BIST) circuitry into an integrated circuit design, the BIST circuitry having a parallel decompressor to concurrently generate in parallel multiple portions of deterministic partially specified data vectors, wherein the parallel decompressor is formed with a LFSR and multiple flip-flop chains with the LFSR and the multiple flip-flop chains being structurally coupled to each other in a manner that allows a plurality of different data bits to be concurrently provided in parallel to different ones of the flip-flop chains and a plurality of different data bits to be concurrently feed back to different parts of the LFSR.

30. The storage medium as set forth in claim 29, wherein the storage medium further having stored therein a second plurality of programming instructions to be executed by the computer system for inserting a boundary scan design into the integrated circuit design.

31. The storage medium as set forth in claim 29, wherein the storage medium further having stored therein a second plurality of programming instructions to be executed by the computer system for generating data seeds for a plurality of deterministic test patterns to be used by the BIST circuitry to test the integrated circuit.

32. A computer system comprising:

a storage medium having stored therein a first plurality of programming instructions; and an execution unit, coupled to the storage medium, to execute programming instructions stored in the storage medium including said first plurality of programming instructions which, when executed by said execution unit, insert a built-in self-test (BIST) circuitry into an integrated circuit design, the BIST circuitry having a parallel decompressor to concurrently generate in parallel multiple portions of deterministic partially specified data vectors from compressed data seeds, wherein the parallel decompressor being formed with a single LFSR and multiple flip-flop chains, with the LFSR and the multiple flip-flop chains being structurally coupled to each other in a manner that allows a plurality of different data bits to be concurrently provided in parallel to different ones of the flip-flop chains and a plurality of different data bits to be concurrently feed back to different parts of the LFSR.

33. The computer system as set forth in claim 32, wherein the storage medium further having stored therein a second plurality of programming instructions to be executed by the computer system for inserting a boundary scan design into the integrated circuit design.

34. The computer system as set forth in claim 32, wherein the storage medium further having stored therein a second plurality of programming instructions to be executed by the computer system for computing data seeds for a plurality of deterministic test patterns to be used by the BIST circuitry to test the integrated circuit.

35. A storage medium having stored therein an integrated circuit design including built-in self-test (BIST) circuitry having a parallel decompressor to concurrently generate in parallel multiple portions of a deterministic data vector, the parallel decompressor being formed with a single LFSR and multiple flip-flop chains with the LFSR and the multiple flip-flop chains being structurally coupled to each other in a manner that allows a plurality of different data bits to be concurrently provided in parallel to different ones of the flip-flop chains, and a plurality of different data bits to be concurrently feed back to different parts of the LFSR.

36. The storage medium as set forth in claim 35, wherein the integrated circuit design further includes boundary scan design.

* * * * *